Figure 1:
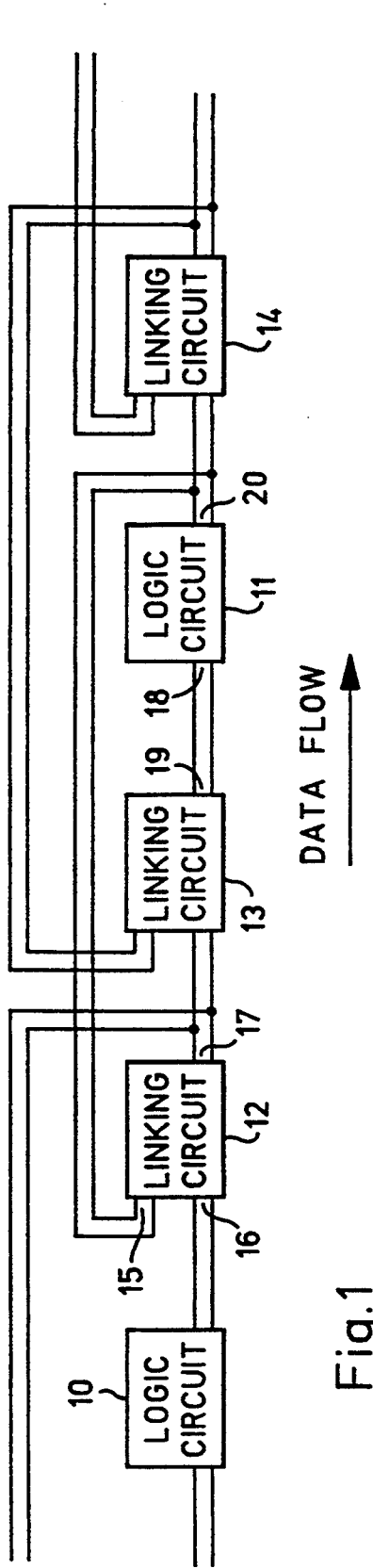

United States Patent [19]
Jones et al.

[11] Patent Number: 5,450,020
[45] Date of Patent: Sep. 12, 1995

[54] SELF-TIMED DIGITAL CIRCUITS USING LINKING CIRCUITS

[75] Inventors: Simon R. Jones, West Bridgford; David W. Lloyd, Nether Edge, both of England

[73] Assignee: British Technology Group Ltd., London, England

[21] Appl. No.: 244,613

[22] PCT Filed: Dec. 3, 1992

[86] PCT No.: PCT/GB92/02247

§ 371 Date: Jun. 3, 1994

§ 102(e) Date: Jun. 3, 1994

[87] PCT Pub. No.: WO93/11486

PCT Pub. Date: Jun. 10, 1993

[30] Foreign Application Priority Data

Dec. 5, 1991 [GB] United Kingdom ................ 9125884

[51] Int. Cl.⁶ .......................................... H03K 19/003
[52] U.S. Cl. .......................................... 326/31; 326/46
[58] Field of Search ........................ 326/21, 31, 62, 46, 326/105

[56] References Cited

U.S. PATENT DOCUMENTS

| | | |
|---|---|---|
| 4,298,982 | 11/1981 | Auerbach . |
| 4,642,807 | 2/1987 | Comroe et al. . |
| 4,697,105 | 9/1987 | Moy ................ 307/443 X |
| 4,841,174 | 6/1989 | Chung et al. ........... 307/443 X |

OTHER PUBLICATIONS

Browne et al: "Checking the Correctness of Sequential Circuits", IEEE International Conference on Computer Design: VLSI In Computers; Oct. 7, 1985 pp. 545–548, see p. 546, left col.ln 22—p. 547, right col.ln 14, FIG. 3
WO,A,8 201 111—Apr. 1, 1982.
Dill et al: "Automatic Verification of Asynchronous Circuits using Temporal Logic"; IEEE Proceedings, vol. 133, No. 5E, Sep. 1986, pp. 276–282.
David et al: "Implementing Sequential Machines as Self-Timed Circuits", IEEE Transactions on Computers, vol. 41, No. 1, Jan. 1992, pp. 12–17.
David et al: Computer Architecture News, vol. 17, No. 6, Dec. 1989, pp. 91–104, XP000165094.
Aghdasi: "Systematic Design of Self-clocked circuits for VLSI applications", IEEE Colloquium on New Directions in VLSI Design, No. 139, Nov. 1989, pp. 1–16.
Aghdasi: "Application of Logic Cell Arrays in Designof Self-Clocked Sequential Circuits", IEEE TENCON'90 Sep. 1990, pp. 519–523, XP000235927.
Gaitanis: Transactions on Computers, vol. 34, No. 8, Aug. 1985, pp. 758–761.

*Primary Examiner*—David R. Hudspeth
*Attorney, Agent, or Firm*—Cushman, Darby & Cushman

[57] ABSTRACT

Testing digital circuits presents problems because in operation not every "stuck at" fault is detected. The present invention provides linking circuits (12, 13, 14) and functional logic circuits (10, 11) which can be used together to provide a system which ceases operation when a "stuck at" fault occurs. Each linking circuit (12) receives a first input (16) from the output of a previous circuit (10) and a second input (15) from the output of a succeeding circuit (20), both in the vicinity of that linking circuit. The signal coding used is such that in normal operation both these inputs will be different in a predetermined way and if not it is an indication that a fault has occurred. Thus if the inputs do not exhibit the predetermined difference, the linking circuit does not pass its first input to its output. The effect is to stop the system from operating and leave it in a condition from which the location of the fault can be detected.

23 Claims, 7 Drawing Sheets

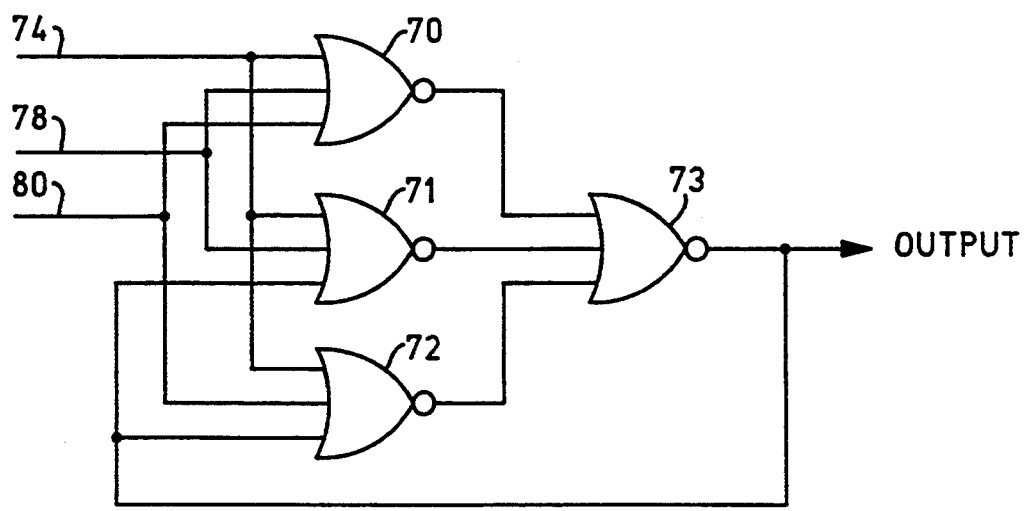
Fig.6
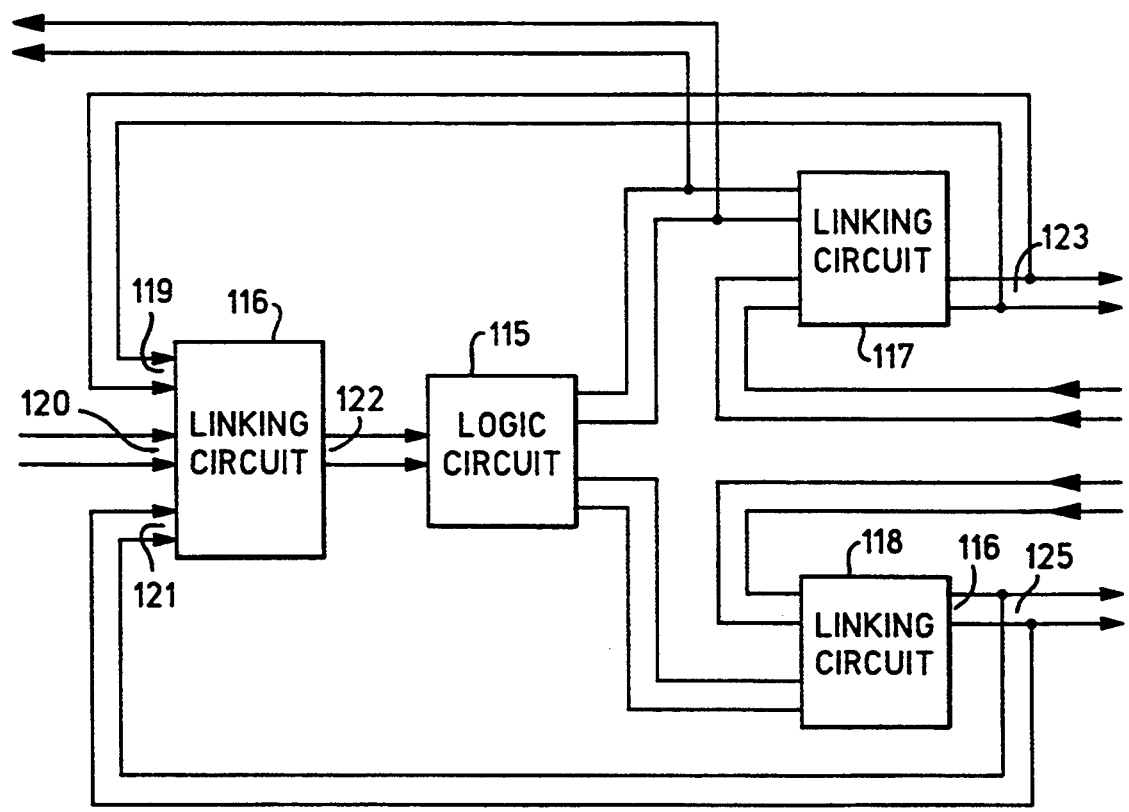
Fig.7   DATA FLOW →

SELF-TIMED DIGITAL CIRCUITS USING LINKING CIRCUITS

This invention relates to linking circuits, particularly to linking asynchronous digital circuits, in such a way as to prevent further operation if a fault occurs. The invention is also concerned with apparatus formed by linking digital circuits in a particular way.

Integrated circuit technology has revolutionized electronic design but severe electrical design problems restrict the use of lower levels of integration. One of the foremost difficulties is the distribution of a high speed and accurate clock that can operate with the sub-nanosecond intervals required by the sub-micron technology. The regular array style of design considered suitable for Very Large Scale Integration (VLSI), complicates the clock distribution because of the large fan-out required to drive the large number of synchronous cells. The much higher speed of Gallium Arsenide circuits means that with even lower levels of integration, clock distribution can still limit the performance.

When a VLSI synchronous circuit is implemented using CMOS technology, the power spike that results from power consumption being focussed on clock edges introduces several electrical noise problems leading to intermittent faults.

Eliminating the clock requires an alternative method of identifying when the data is valid; typically a data ready/acknowledge protocol is used. The data ready signal is realized through a dual rail coding method where each single bit is manifest by a signal change on one of the two connections that form an individual signal path.

Circuits which do not need clock signals to synchronize themselves are known as self-timed circuits. Such circuits operate at the average circuit delay rate, unlike synchronous circuits which have to operate at the speed of the slowest component. Self-timed circuits also spread the switching of circuits, leading to lower peak power requirements.

Testing complex digital circuits is expensive and time-consuming since each element within the circuit must be tested with every possible combination of data values. Testing of self-timed circuits is also constrained because not every "stuck at" fault (that is a fault in which a connection is stuck at a steady voltage) is detected. There may be a large number of potential stuck at faults, making this problem more difficult.

It is an object of this invention to provide circuits which link functional logic circuits in a way which indicates the presence of stuck at faults by ceasing to provide output signals.

According to a first aspect of the invention there is provided a linking circuit for transmitting data values represented by code values, the code values being represented in the linking circuit by different states of a predetermined finite state machine, none of these states having a transition to itself, each state being represented by a combination of logic values and all transitions between states requiring a change in predetermined number of the logic values, the linking circuit comprising first and second inputs, an output and holding means for holding a state representing a code value received at the first input if the code values applied to the first and second input represent different states of the finite state machine, and the transition to the state received from the state currently held by the holding means is a legitimate transition as defined by the finite state machine.

Linking circuits may be used to couple functional logic circuits in achieving the above objects. One or two linking circuits alternating with logic circuits can provide a self-timed arrangement. Not passing a data state to its output, unless a legitimate transition is involved and inputs of preceding and succeeding linking circuits are in different states, allows such a self-timed arrangement to be operated and causes the arrangement to lock-up, stopping its output data stream if a stuck at fault occurs.

Restricting the finite state machine to one in which states which represent data do not have transitions to themselves allows the linking circuit to function when two or more successive input data values are the same. Preferably the predetermined number of logic values required by a change in state is one, so avoiding any ambiguity arising from the possibility of spurious intermediate states being wrongly identified.

The finite state machine preferably has three states, comprising first and second states representing different respective code values which each represent data, and a third state representing a further code value which represents the absence of data. The finite state machine then has transitions to, and from, the first and third states, and, to and from, the second and third states, only. With this finite state machine, when data is to be processed, code values representing data are alternated with code values representing the absence of data. In this way a data ready/acknowledge protocol is provided.

A data path formed by linking logic circuits using linking circuits may branch into a plurality of such paths, or a number of data paths may merge into a single path. Where branching or merging occurs the protocol has to be maintained.

According to a second aspect of the invention there is provided a method of carrying out logical processing on a succession of data values using a succession of alternating linking circuits and functional logic circuits, in which the logical processes are carried out, wherein in the circuits the code values are represented by different states of a predetermined finite state machine, none of these states having a transition to itself, each state being represented by a combination of logic values and all transitions between states requiring a change in a predetermined number of the logic values, and each circuit temporarily holds one state as it passes along the succession of circuits, comprising

- initialising the linking circuits to take up a different state from each adjacent linking circuit in the succession thereof,
- initialising each functional logic circuit to take up the same state as the preceding linking circuit,
- applying the data as a succession of code values to the beginning of the succession of circuits,
- for each linking circuit except the first, repeatedly changing the state held by that circuit to the state held by the preceding circuit if, and only if, the state held by the succeeding circuit differs from that held by the preceding circuit and the transition from the state held to the state next to be held is legitimate as defined by the finite state machine, and
- removing the code values at the end of the succession of circuits to output data values.

According to a third aspect of the invention there is provided a functional logic circuit for use with a linking circuit comprising logic means for carrying out a logical process, and guard means comprising first and second state holding means with outputs connected to first and second output connections of the logic circuit, respectively, wherein the guard means also comprises means for preventing the output of the logic means from appearing at the output formed by the first and second state holding means unless all code values received at all circuit inputs to the functional logic circuit represent the same state, or states separated by one state in the sequence of operation of the finite state machine.

The said means for preventing ensure that when a logic circuit changes a data value, the operation of the finite state machine continues without indicating a fault.

Figure 2:
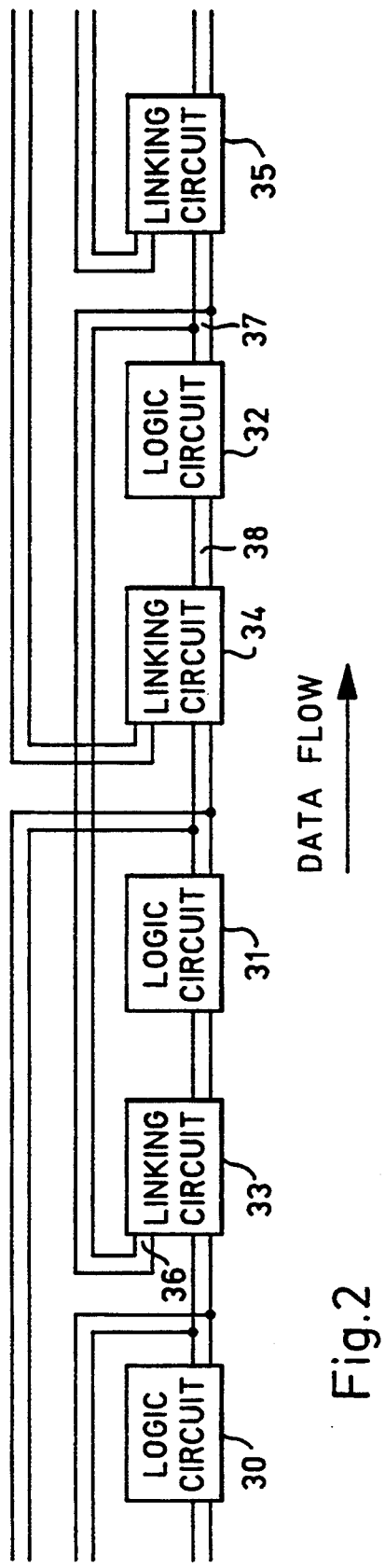
Figure 3:
Figure 4:
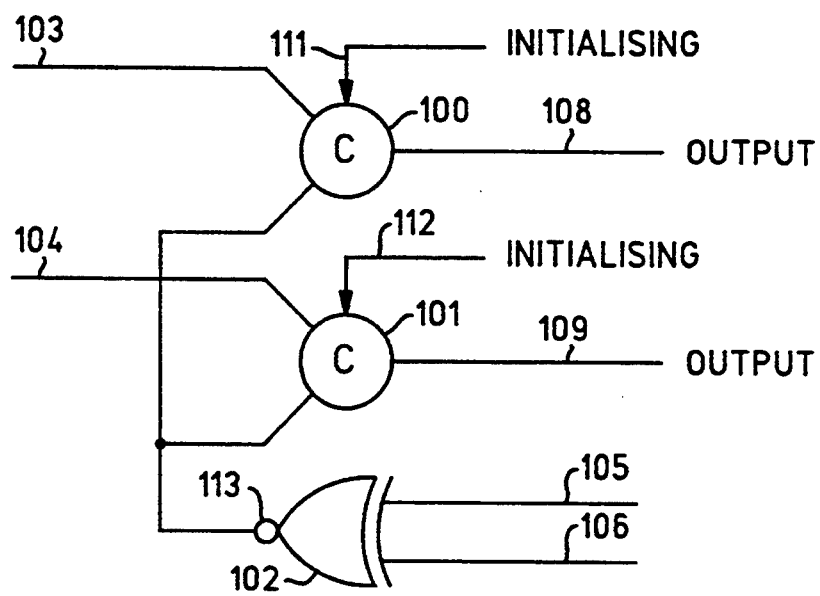
Figure 5:
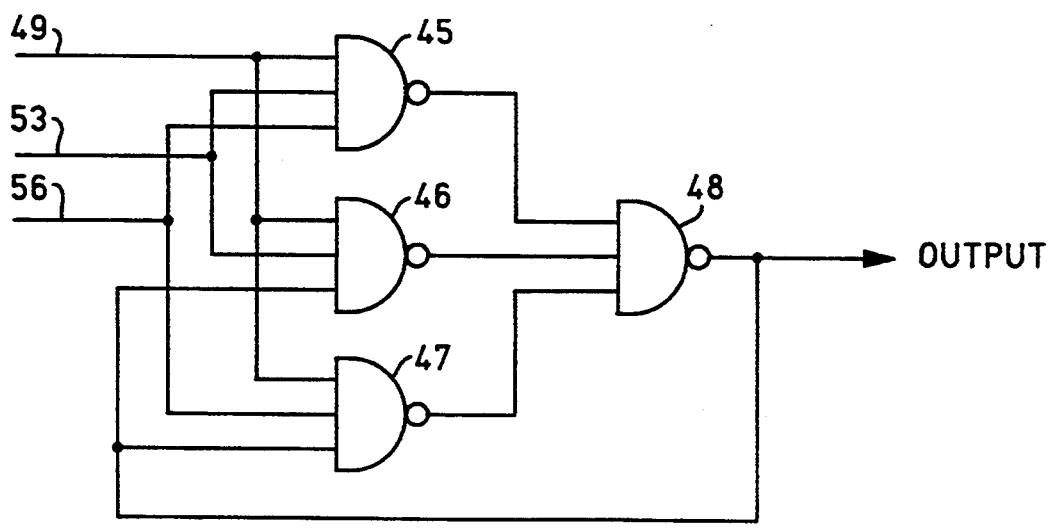
Figure 8:
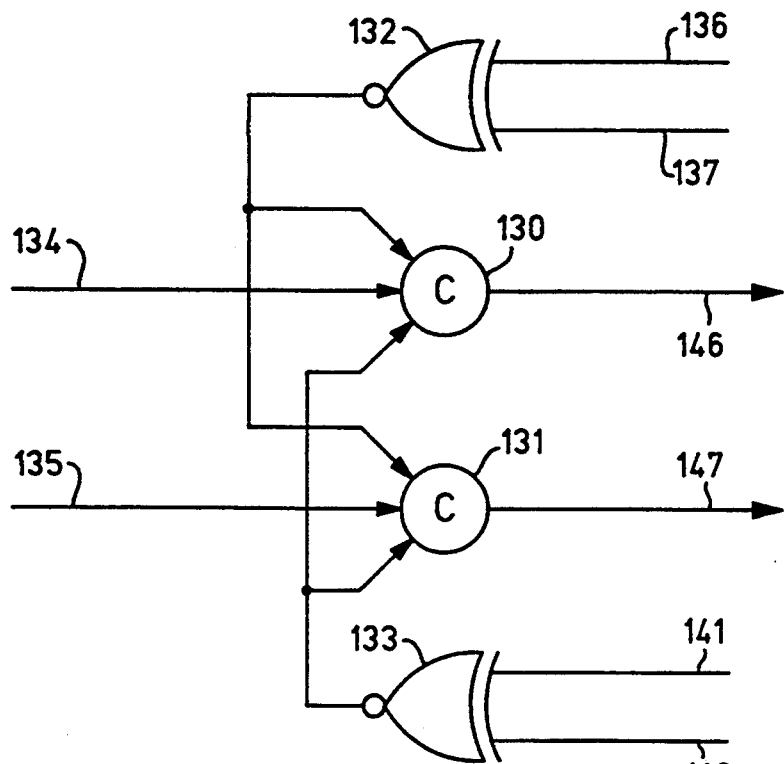
Figure 9:
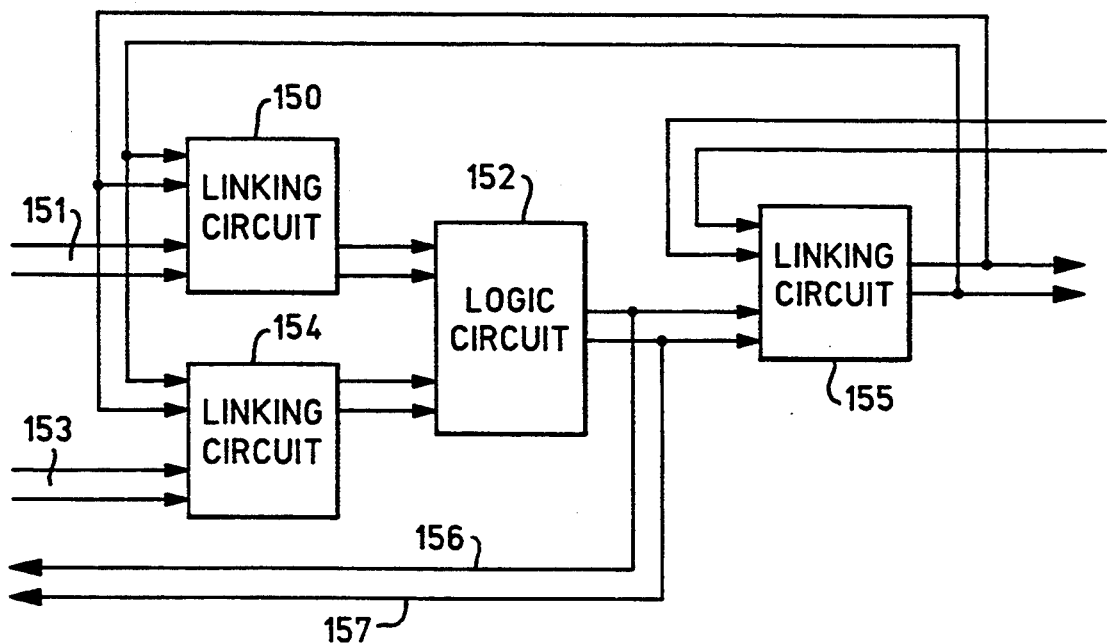
Figure 10:
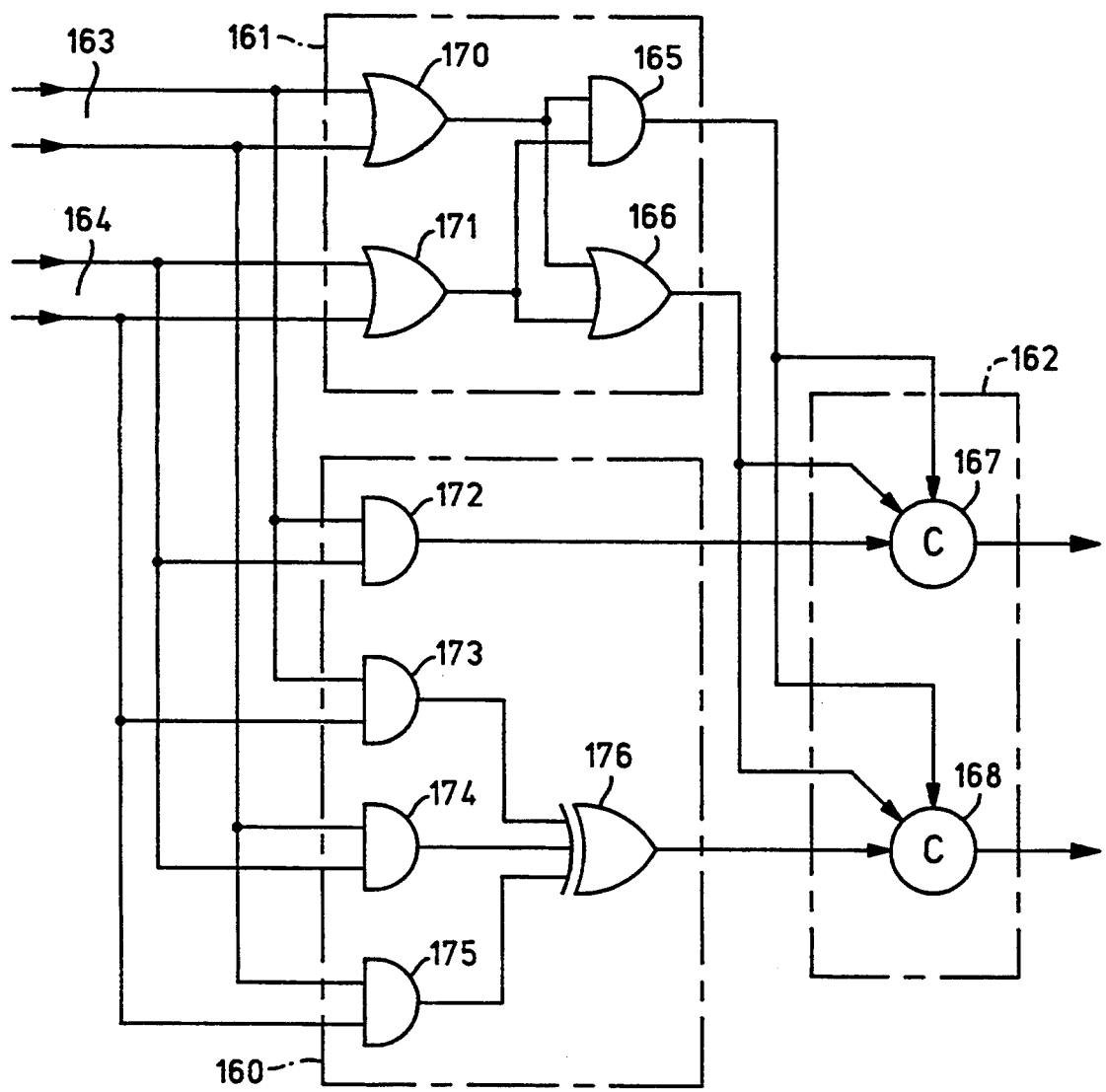
Figure 11:
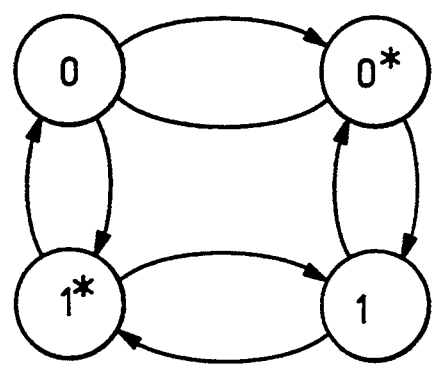
Figure 12:
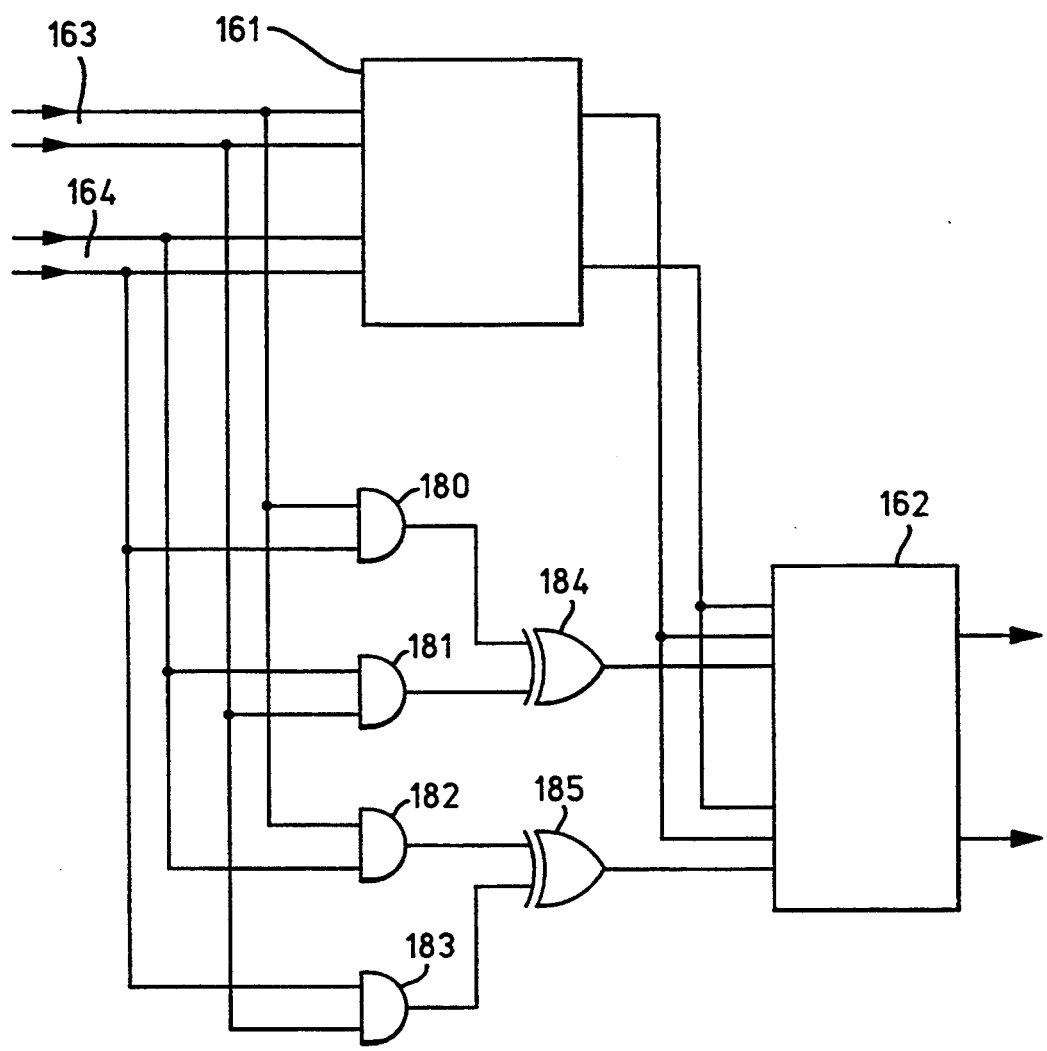
Figure 13:
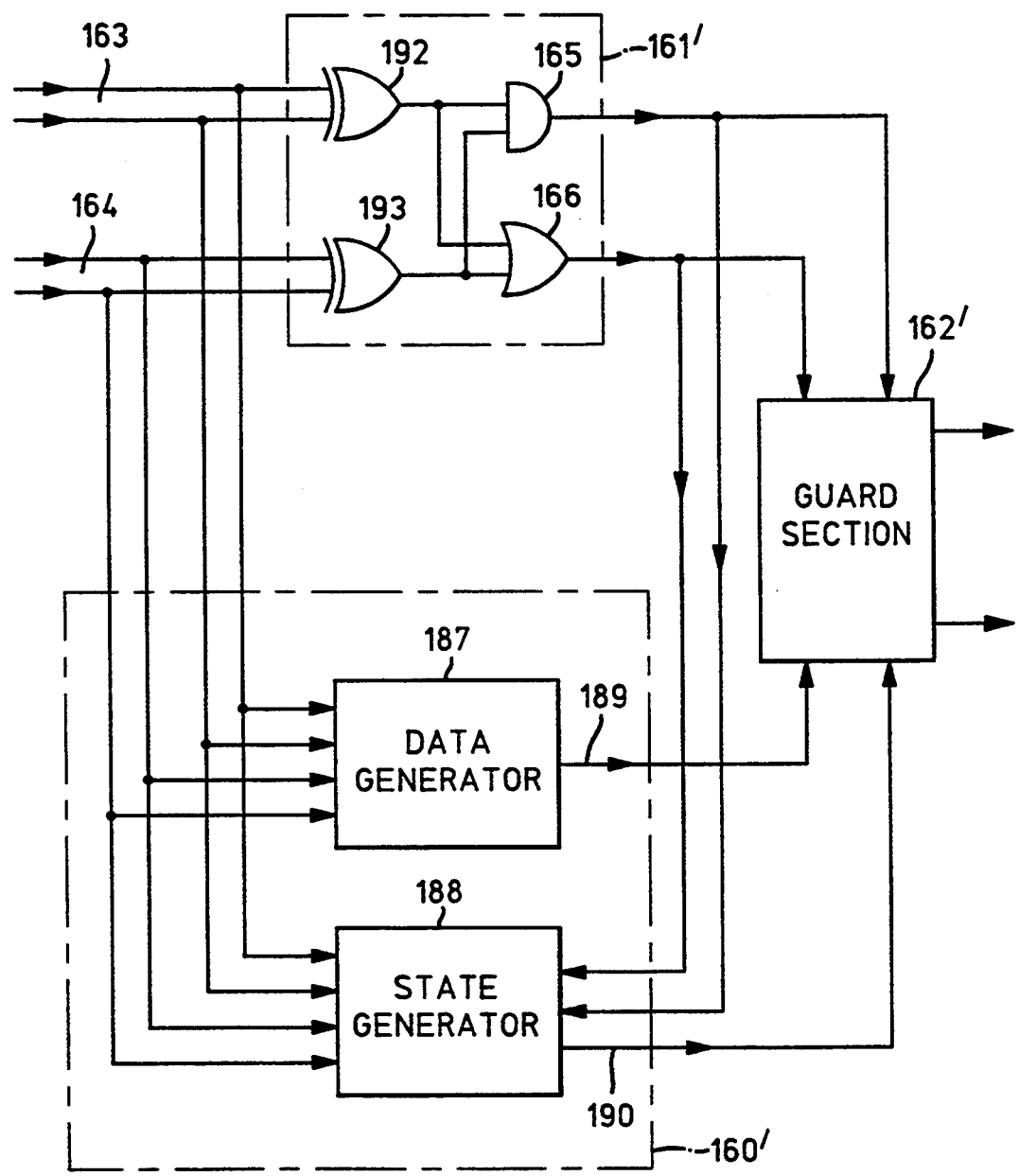

Certain embodiments of the invention will now be described by way of example with reference to the accompanying drawings, in which:

FIG. 1 is a block diagram of an embodiment of the invention including linking circuits and logic circuits, FIG. 2 is a block diagram of an alternative embodiment of the invention, FIG. 3 shows the predetermined finite state machine for return to zero coding, FIG. 4 shows an implementation of a linking circuit using Muller C-elements and a NOT(EXOR) gate, FIG. 5 shows an implementation of a first Muller C-element, FIG. 6 shows an implementaion of a second Muller C-element, FIG. 7 is a block diagram of an embodiment of the invention including linking circuits and a logic circuit arranged to branch two signal paths, FIG. 8 shows a linking circuit for use in the arrangement of FIG. 7, FIG. 9 is a block diagram of an embodiment of the invention including linking circuits and a logic circuit arranged to merge two signal paths, FIG. 10 is a logic circuit for an AND gate which may be used in embodiments of the invention, FIG. 11 shows a finite state machine for a two phase coding system, FIG. 12 is a logic circuit for an EXOR gate used in explaining the derivation of logic circuits for some embodiments of the invention, and FIG. 13 is a logic circuit for embodiments of the invention which use only valid data states.

Part of a circuit for carrying out a logical process on input signals is shown in FIG. 1 where two logic circuits 10 and 11 which carry out parts of the process are coupled by linking circuits 12 and 13. A further linking circuit 14 is one of a pair of such circuits which couple a further logic circuit (not shown). In this way the complete circuit for carrying out the process is made up from logic circuits coupled by pairs of linking circuits.

The linking circuit 12 has two inputs 15 and 16 and an output 17 each comprising two connections, as do the other linking circuits. The logic circuit 11 has an input 18 coupled to the output 19 of the linking circuit 13 and an output 20 connected to the input of the linking circuit 14, each comprising two connections. Examples of the linking and logic circuits are described below.

Over small areas, known as isochronous or equipotential regions, the signal may be treated as identical at all points in a region. This approximation is justified so long as the region is sufficiently small that the delay in equalizing the potential along a connection in the region is small in comparison with switching delays or transition times. The size of the isochronous region thus determines the amount of circuitry, considered as a block of functional logic, between linking circuits. It also determines the delay between a fault occurring and the detection of that fault by a linking circuit.

Data is transmitted through the circuit by a protocol shown in Table 1 which can be described by a finite state machine shown in FIG. 3.

TABLE 1

| Connection 1 | Connection 2 | Condition |
|---|---|---|
| 0 | 0 | No valid data condition |
| 0 | 1 | Valid data condition-Data value '0' |
| 1 | 0 | Valid data condition-Data value '1' |
| 1 | 1 | Illegal condition |

The "0"s and "1"s in Table 1 are logic values which are represented by voltage levels on the two connections of the inputs and outputs of FIG. 1. The first three pairs of logic values in the first two columns of Table 1 form code values representing no valid data (that is absence of data) and two data values "0" and "1", respectively. Since the finite state machine has no transitions from a data state to itself, two or more successive data values which are the same can be distinguished. This method of data transmission is known as return to zero coding.

Data values are represented by complementary logic values on two different single wire connections and, in the arrangement of FIG. 1, when data has been accepted by a linking circuit, the preceding linking circuit detects the change from its input which is connected to the succeeding linking circuit. Thus an acknowledgement of data received is given and the preceding circuit then lowers both connections to zero. The system therefore two transitions on one of the two connections per bit transmitted. The no valid data condition, represented by both connections at logic low, alternates with the valid data condition, represented by one of the connections at logic high. Thus there are two legitimate conditions and data is passed out of the system as alternating valid data and no valid data. Any block of functional data manipulates data but does not change the condition of the data, that is, valid data remains valid even though the value of the data has been altered. This means that the input and the output of the functional logic remains in the same condition.

In order to allow data flow each linking circuit has to obey two rules.

Rule 1. For any linking circuit forming part of a sequence of linking and logical circuits in a signal path, the input of the linking circuit is passed to its output if, and only if, the conditions of the outputs of the preceding and succeeding linking circuits are different.

Rule 2. Each linking circuit must include means allowing it to be set to any legal condition to allow successive linking circuits in a signal path to be initialised by being set to alternate conditions.

Furthermore each functional logic circuit must include means allowing it to be set to the same condition as the preceding linking circuit.

Thus initially in operation the linking circuits in FIG. 1 may be set as shown in the "Initialisation" row of Table 2 where "V" represents either valid condition and "NV" represents the non-valid condition. Assuming that another linking circuit or an output circuit exists to the right of the circuit 14 in FIG. 1, then at a first time interval, corresponding to the second row, the preceding and succeeding input conditions to the linking circuit 14 are different, and this circuit passes its input condition (that is the output condition of the circuit 13) to its output as shown for the second interval (row 3). In the second interval the input conditions for the circuit 13 are different so the input condition of this circuit passes to its output as shown in the third interval (row 4). This process continues until the valid condition shown in the "In" row moves to the output of the circuit 12. Provided further alternate non-valid and valid inputs are supplied, the valid condition at the output of the circuit 12 and other such valid conditions supplied, progress through the linking circuits 13 and 14 and the logical circuit 11, where the state of the valid condition may be changed, to the output.

TABLE 2

| TIME INTERVALS | LINKING CIRCUIT OUTPUT CONDITIONS | | | |
|---|---|---|---|---|
| | IN | 12 | 13 | 14 | OUT |
| INITIALISATION | | NV | V | NV | |
| 1 | V | NV | V | NV | NV |
| 2 | V | NV | V | V | NV |
| 3 | V | NV | NV | V | NV |
| 4 | NV | V | NV | V | NV |

However should a fault occur causing one of the connections in the circuit to become stuck at a logical "one" or "zero" the alternate sequence of valid and non-valid conditions no longer exists and, as a consequence of Rule 1, the flow of data ceases indicating that a fault has occurred.

A fault may be apparent from either an illegal state transition or an illegal state as apparent from the finite state machine of FIG. 3 by the absence of a transition or state.

The inter-coupling of linking circuits ensures that the nearest neighbouring linking circuit to a logic circuit in which a fault occurs detects the cessation of data movement and halts the passage of data through linking circuits. Downstream of the fault, with regard to the direction of data flow, a linking circuit detects the fault when the output from the preceding linking circuit does not change condition and the output of the succeeding linking circuit changes to that condition. Upstream of the fault, with regard to the direction of data flow, a linking circuit detects the fault when the output of the succeeding linking circuit does not change condition and the output of the preceding linking circuit changes to that condition. After a period of time the effect spreads and data movement is suspended throughout the system.

The position of a fault can be found by monitoring the order in which the linking circuits cease to pass data. This feature is useful for discrete functional logic circuits but for integrated circuits it is usually better to discard the integrated circuit rather than attempt fault finding and repair.

Any implementation of a linking circuit must perform two tasks. Firstly, it must deduce the state of the preceding and succeeding linking circuits from their respective data connections. Secondly, it must have some form of state holding element which maintains the output until signalled to pass the state that exists on its input to its output.

A linking circuit with input connections 103 and 104 and output connections 108 and 109 is shown in FIG. 4, where a NOT(EXOR) gate 102 is, in operation, connected to the succeeding linking circuit and, as is apparent from the "truth table" (not shown) for such a gate, outputs a logic one when the succeeding circuit is in the non-valid or the illegal condition (that is "0,0" or "1,1") and a logic zero when the succeeding circuit is in either of the valid conditions (that is "0,1" or "1,0").

The state holding element could be implemented using, for example, an SR latch fed by the appropriate combinational logic. However, the ideal behaviour of such a circuit may not match the logical implementation and could not be guaranteeed to operate correctly in all conditions. Two Muller C-elements are suitable and two such circuits are indicated in FIG. 4 at 100 and 101.

There are many possible implementations of the Muller C-element circuit. FIG. 5 shows an implementation using four three-input NAND gates 45, 46, 47 and 48. An initialising connection 49 is coupled to one input of each of the NAND gates 45, 46 and 47 respectively. The input connection 53 is coupled to one input of the NAND gate 45 and one input of the NAND gate 46. The input connection 56 is coupled to one input of the NAND gate 45 and one input of the NAND gate 47. The output of NAND gate 48 is coupled to one input of NAND gate 46 and one input of the NAND gate 47. The outputs of the NAND gates 45, 46 and 47 are coupled to respective inputs of the NAND gate 48.

FIG. 6 shows another implementation of the Muller C-element which uses four three-input NOR gates 70, 71, 72 and 73. An initialising connection 74 is coupled to one input of each of the NOR gates 70, 71 and 72 respectively. The input 78 is coupled to one input of the NOR gate 70 and one input of the NOR gate 72. The input 80 is coupled to one input of NOR gate 70 and one input of the NOR gate 71. The output of the NOR gate 73 is coupled to one input of NOR gate 71 and one input of the NOR gate 72. The outputs of the NOR gates 70, 71 and 72 are coupled respectively to three inputs of the NOR gate 73. Consideration of the truth table of FIG. 6 shows that it provides the same outputs as the circuit of FIG. 5 for respective combinations of inputs.

The truth table (not shown) for the circuits of FIGS. 5 and 6 indicates that if the inputs 53 and 56 (referring to FIG. 5) are both logical zero the output 61 is a logical zero. Similarly if both inputs are one then the output is 1. The output remains unchanged for either of the other input combinations 0,1 and 1,0.

TABLE 3

| INPUTS | | OUTPUTS | | |
|---|---|---|---|---|
| NOT (EXOR) | MCs | NOT (EXOR) | MC 1 | MC 2 |
| V | V | 0 | 0 | NC |
| NV | NV | 1 | NC | NC |
| V | NV | 0 | 0 | 0 |
| NV | V | 1 | NC | 1 |

Reference to Table 3 shows that Rule 1 is obeyed by the linking circuit of FIG. 4. When both the NOT-(EXOR) gate 102 and the Muller C-elements (MCs) 100 and 101 receive valid conditions one MC receives two logic zeros and the other a logic one and a logic zero. The former outputs a zero and the latter does not change (NC) its output. As a result the input condition of the linking circuit is not passed to its output. When both the gate 102 and the MCs receive non-valid conditions both MCs receive a zero and a one, their outputs do not change and again the linking circuit does not pass its input condition to its output. With the gate 102 receiving a valid condition and the MCs receiving a non-valid condition (0,0) both MC outputs are forced to zero and the input condition of the linking circuit passes to its output. A non-valid condition applied to the gate 102 while the MCs receive a valid condition forces the output of one MC to one but the output of the other does not change so the valid condition appears at the linking circuit output.

In order to allow initialisation according to Rule 2, alternate linking circuits use two "NAND-gate" C-elements of the type shown in FIG. 5, while each linking circuit between the alternate circuits uses one "NAND-gate" C-element and one "NOR-gate" C-element (as shown in FIG. 6).

To initialise to the valid condition initialising inputs 111 and 112 (49 in FIG. 5) are both set to logic zero which forces the outputs of both Muller C-elements to zero and to initialise to a non-valid condition the inputs 111 (49 in FIG. 5) and 112 (74 in FIG. 6) are set to logic zero and to one, respectively, so that one Muller C-element of the type shown in FIG. 5 outputs logic zero and the other of the type shown in FIG. 6 outputs logic one. If a logical circuit is one which holds a code value then those logic circuits are also initialised to an appropriate code value as mentioned below.

Since a functional logic circuit may change the data value of the valid condition but not the condition itself, a group of two or more such circuits connected in sequence may be positioned in place of the circuit 11, for example in FIG. 1, but then faults can only be localised as occurring somewhere in the group. In another arrangement, for example as shown in FIG. 2, logic circuits 30, 31 and 32 are coupled by linking circuits 33, 34 and 35. In this embodiment only one linking circuit is used to couple each pair of logic circuits. The input 36 to the linking circuit 33 is coupled to a point 37 downstream of the logic circuit 32. As in the previous example, the input 36 to linking circuit 33 may be coupled to a point 38 upstream of the logic circuit 32.

The arrangement of input connections for a linking circuit from preceding linking circuits is preserved so that operation is as described above but faults can be localised to functional logic circuits more precisely since the ratio of functional logic circuits to linking circuits is now one to one. However logic circuits separated by only one linking circuit cannot function at the same time without the buffering action given by a pair of linking circuits.

Part of a circuit for branching a single signal path into two signal paths is shown in FIG. 7 where a logic circuit 115 at which branching occurs is coupled to linking circuits 116, 117 and 118. The linking circuit 116 has three inputs 119, 120 and 121 and an output 122 each comprising two connections and the other two linking circuits 117 and 118 are as described before. The input 119 of the linking circuit 116 is coupled to a point 123 downstream of the output 124 of linking circuit 117. The input 121 of linking circuit 116 is coupled to a point 125 downstream of the output 126 of the linking circuit 118.

Any implementation of the linking circuit which precedes a branch has n+1 inputs, where n is the number of branches. FIG. 8 shows an implementation of the linking circuit 116 comprising two Muller C-elements 130 and 131 and two NOT(EXOR) gates 132 and 133. Input connections 134 and 135 represent two connections which form the input 120 of linking circuit 116 in FIG. 7. The two input connections 136 and 137 of the NOT(EXOR) gate 132 represent the two connections which form the input 119 of the linking circuit 116 in FIG. 7. The output of the NOT(EXOR) gate 132 is coupled to two inputs of the respective Muller C-elements 130 and 131. The two input connections 141 and 142 of the NOT(EXOR) gate 133 represent the two connections which form the input 121 of the linking circuit 117 in FIG. 1. The output of the NOT(EXOR) gate 132 is coupled to two inputs of the respective Muller C-elements 130 and 131. The outputs 146 and 147 of the two Muller C-elements 130 and 131 represent the two connections which form the output 122 of the linking circuit 116 in FIG. 7. The initialising connections are provided as in FIG. 6.

The linking circuit of FIG. 8 is constructed to ensure that the code value applied to the connections 134 and 135 is passed to be held on the connections 146 and 147 if, and only if, the condition it represents is different from the condition of each of the code values applied to the pairs of connections 136 and 137, and 141 and 142.

Each Muller C-element 130 and 131 now has four inputs (including an initialising input not shown in FIG. 8) instead of three. To provide this further input the Muller C-element of FIG. 5 is modified by the addition of a further NAND gate which receives a Reset input, one input from the further input and one from the output NAND gate 48. The output of the further NAND gate is connected as an input to the NAND gate 48 and the further input of the modified Muller C-element is also connected as an input to the NAND gate 45. Similar modifications are made to the Muller C-element of FIG. 6.

The circuit of FIG. 9 may be used to merge two data paths, one of which has a last linking circuit 150 with an input 151 and an output connected to one input of a fucntional logic circuit 152. The other data path is similar with an input 153 and a last linking circuit 154 with its output connected to a second input of the logic circuit 152. A linking circuit 155 is the first circuit in the merged path and its output is connected back to second inputs of the linking circuits 150 and 154. The output of the logic circuit 154 has connections 156 and 157 which are connected back to inputs of two linking circuits (not shown) one in each of the two paths to be merged, preceding the linking circuits 150 and 154, respectively. More than two paths can be merged in a similar way as will be apparent from FIG. 9.

Functional logic circuits require modification in order to function with the coding of Table 1 and an example of an AND gate is shown in FIG. 10. The AND function is performed by the section indicated by the chain dashed line 160. This section comprises four AND gates 172 to 175 connected to form all possible combinations of the input connections of the inputs 163 and 164, and an EXOR gate 176 with inputs coupled to the outputs of the gates 173, 174 and 175. In addition to the section 160 two guard sections 161 and 162 are required to ensure that the AND gate does not provide an output until both its inputs 163 and 164 have codes representing data or the absence of data. The section 161 determines the status of the inputs giving two logic ones at the outputs of gates 165 and 166 if data is present at both inputs and two logic zeros if data is absent from both inputs, while a one and a zero indicate that one input has data while the other does not. This section comprises two OR gates 170 and 171 with inputs acting as the circuit inputs 163 and 164, and the AND gate 165 and the OR gate 166, each receiving one input from the output of one of the gates 170 and 171. The section 162 controls the output only letting the output of the section 160 appear at the outputs of two Muller C-elements 167 and 168 if the outputs from the guard section indicate that both inputs 163 and 164 have data or both do not. The Muller C-elements may be as described in connection wih FIG. 5 or FIG. 6 as modified for FIG. 8. Since functional logic circuits must be initialised to the same condition as the preceding linking circuit, the C-elements chosen for a particular logic circuit will depend on its position in the circuit. If it is to initialise to the non-valid condition two C-elements of the type shown in FIG. 5 are used but if initialisation is to be to the valid condition one C-element of the type shown in FIG. 5 is used and one of the type shown in FIG. 6.

Other functional logic circuits can be devised in a similar manner using guard sections, for example an OR gate uses guard sections 161 and 162 which are the same as for the AND gate of FIG. 10 but the section 160 is changed by connecting the outputs of the AND gates 172, 173 and 174 as the input for the EXOR gate 176 and while the output of the EXOR gate 176 is taken to the Muller C-element 167, the output of the AND gate 175 is taken to the Muller C-element 168.

Rules for constructing suitable logic circuits are now given:
1. Guard sections 161 and 162 are as shown in FIG. 10.
2. In section 160, product terms are formed by/AND gates, one AND gate for each term ("product term" is a known expression used in Boolean algebra).
3The outputs of those AND gates forming "false" and "true" product terms are used as inputs for first and second EXOR gates, respectively, but where there is only/one AND gate for a product term the EXOR gate for that term is not required. As an example an EXOR gate, zero coded, is now considered. The truth table for such a gate is as shown in Table 4.

TABLE 4

| Input A | | Input B | | Output | | |
|---|---|---|---|---|---|---|
| t | f | t | f | t | f | True or False |
| 0 | 0 | 0 | 0 | 0 | 0 | |
| 0 | 1 | 0 | 1 | 0 | 1 | ) False product |
| 1 | 0 | 1 | 0 | 0 | 1 | ) terms |
| 0 | 1 | 1 | 0 | 1 | 0 | ) True product |
| 1 | 0 | 0 | 1 | 1 | 0 | ) terms |

From Table 1 is data value '0', that is a 'false', occurs when for input 163, the upper connection is at level '0' and the lower connection is at level '1'. Also a data value of '1', that is 'true', occurs when for input 163 the upper connection is at level '1' and the lower connection is at level '0'. This convention applies generally in this specification and in particular to the input 164 and the connections at the inputs to the Muller C-elements 167 and 168, where a '1' on the former and a '0' on the latter represent the data value '1' and vice versa for the data value '0'. Thus false products are those where the element 167 receives a '0' level and the element 168 receives a '1', and true products are those where the elemnents 167 and 168 receive '1' and '0', respectively.

Table 4 shows four product terms: two true and two false. Thus from the above rules four AND gates are required. FIG. 12 shows an EXOR gate based on Table 4 where these gates are AND gates 180 to 183. Assuming the inputs 163 and 164 correspond to inputs A and B, respectively in Table 4, gates 180 and 181 produce true product terms and gates 182 and 183 produce false product terms. Again following the rules, the outputs of the gates 180 and 181 are connected as inputs to an EXOR gate 184, and the outputs of gates 182 and 183 are connected as inputs to an EXOR gate 185.

Where logic circuits have more than two inputs (each with two connections) sections 160 and 162 remain as described above, but note that for section 160 the number of AND gates depends on rule 2 above. For section 161 as many two input OR gates are required as there are two-connection inputs. As a result the number of inputs for the AND gate 165 and for the OR gate 166 is increased accordingly, and one output from each of the OR gates, corresponding to the OR gates 170 and 171, is taken to each of the AND gate 165 and the OR gate 166 (with increased numbers of inputs).

The method of coding described previously has redundancy of at least 50%, since every valid data state is preceded and succeeded by a no valid data state. An alternative is to use a coding system where there are only valid data states. Data is transmitted by a protocol shown in Table 5 which can be described by the finite state machine shown in FIG. 11.

TABLE 5

| Connection 1 | Connection 2 | Condition |
|---|---|---|
| 0 | 0 | 0 - Data value '0' |
| 0 | 1 | 0* - Data value '0' |
| 1 | 0 | 1* - Data value '1' |
| 1 | 1 | 1 - Data value '1' |

Each data value (data 0 or data 1) is represented by two valid states and the system requires only one transition on one of the two connections per bit transmitted. Unlike the previous coding system, a fault is only apparent from an illegal state transition, since there are no illegal states. Linking circuits are constructed to use this protocol, ceasing to pass data if an illegal transition occurs, as are functional circuits, and an arrangement of linking and logic circuits is initialised with alternate code values. Functional circuits are arranged to output a different code value if two successive data values are the same.

The states can be divided into complementary states where one logic value is the complement of the other (rows two and three of Table 5) and equal states where the two logic values are the same (rows one and four of Table 5). Linking circuits behave in a similar manner as for zero coding but alternate between complementary and equal states rather than between one of the valid data conditions and the no-valid-data condition. Thus the configurations for linking circuits are the same as shown in FIGS. 1, 2, 7 and 9. The linking circuits of FIGS. 4 and 8 are also unchanged except that the NOT-(EXOR) gates 102, 132 and 133 are replaced by a logic circuit which permits the code value of the input connected to the output of the previous logic or linking circuit to appear at the outputs of the Muller C-elements only if the input connected to the succeeding circuit is in a different state; that is one input to the linking circuit must be in the complementary state and the other in the equal state.

Functional logic circuits for valid states only coding have the same general configuration as FIG. 10 in that they are formed by a logic section and two guard sections, but these sections are different in detail. FIG. 13 shows a generalised functional logic circuit with a logic section 160' and guard sections 161' and 162'.

The section 160' has a data generator circuit 187 which outputs a '1' or a '0' on the connection 1 (designated 189) according to the required logical combination of signals at inputs 163 and 164. A state generator 190 is also provided which performs as follows:

If both inputs (163 and 164) are in the complementary state then the connection 2 (designated 190) is set to the complement of the connection 1, and (b) If both inputs (163 and 164) are in the equal state then the connection 2 is set to be the same as the connection 1.

The state generator circuit does not provide an output if one input is in the complementary state and one is in the equal state as indicated by the output of the circuit 161'.

In section 161', the gates 170 and 171 of the section 161 are replaced by EXOR gates 192 and 193. The section 162' is the same as shown at 162 in FIG. 10 except for the addition of a logic circuit which outputs a logic 0 when the output of the circuit 161' is in an equal state and a logic 1 when the output of the circuit 161' is in a complementary state.

Although certain embodiments have been described it will be apparent that the invention can be put into practice in other ways using different protocols, numbers of connections or finite state machines. Also different forms of linking circuits and functional logic circuits may be used. The invention can be applied to synchronous circuits if, for example, a clock is used to sample inputs.

We claim:

1. A linking circuit for transmitting data values represented by code values, the code values being represented in the linking circuit by different states of a predetermined finite state machine, none of these states having a transition to itself, each state being represented by a combination of logic values and all transitions between states requiring a change in a predetermined number of the logic values, the linking circuit comprising first and second inputs, an output and holding means for holding a state representing a code value received at the first input if the code values applied to the first and second input represent different states of the finite state machine, and the transition to the state received from the state currently held by the holding means is a legitimate transition as defined by the finite state machine.

2. A linking circuit according to claim 1 wherein the finite state machine has three states, comprising first and second states representing different respective code values which each represent data and a third state representing a further code value which represents the absence of data, and the finite state machine has transitions to and from the first and third states, and to and from the second and the third states, only.

3. A linking circuit according to claim 2 wherein the holding means is arranged to hold a code value received at the first input if the code value applied to the first input represents a data value and the code value applied to the second input represents the absence of a data value or vice versa.

4. A linking circuit according to claim 3 wherein the said inputs and outputs each have two connections, and wherein the absence of a data value is represented by the presence of first logic value at each of the two connections, a data value of zero is represented by the first logic value at one of the connections and a second logic value at the other connection, and a data value of one is represented by the second logic value at the said other connection and the first logic value at the said one connection.

5. A linking circuit according to claim 4 wherein the holding means comprises a logic gate having an input connected to the two connections of the said second input to provide the first and second logic values when the second input receives code values representing the presence and absence, respectively, of data, and first and second state-holding means each with two inputs and an output, one input being connected to the output of the logic gate, the other input being connected to a respective one of the input connections of the said first input, and the two outputs of the state holding means forming the output connections of the linking circuit, each state-holding means being arranged to set its output to one of the logic values only when that logic value is present at its two inputs.

6. A linking circuit according to claim 5 wherein the logic gate is a NOT(EXOR) gate.

7. A linking circuit according to claim 5 wherein each state-holding means is a Muller C-element.

8. A linking circuit according to claim 5 including means for setting each state-holding means to provide a selected one of the first and second logic values at its output.

9. A linking circuit according to claim 1 wherein the finite state machine has four states, each representing a code value and the machine has transitions to and from all states except where a transition would require a change in two logic values, two code values are provided for each data value and when a data value is to be transmitted immediately after the transmission of the same data value, a different code value is used from the code value used immediately before.

10. A linking circuit according to claim 9 for use where there are two data values, each of which can be represented by two of the code values formed by different combinations of two logic values, two of the code values, which represent different data values, are represented by complementary combinations of logic values, and two of the code values, which also represent different data values, are equal in that both logic values in one equal combination are the same, wherein the holding means is arranged to hold a value received at the first input if the code values received at the first and second inputs both represent complementary values or both represent equal values.

11. Apparatus including a circuit according to claim 1 and a functional logic circuit, the output of the linking circuit being coupled to the input of the functional logic circuit, or the output of the functional logic circuit being coupled to one of the inputs of the linking circuit.

12. Apparatus including at least two linking circuits according to claims 1 or 4 and at least one functional logic circuit, the linking circuits and the functional logic circuit or circuits being coupled in sequence in a signal path with the or each logic circuit between two linking circuits, each linking circuit, except the first, having its first input coupled to the output of the preceding linking circuit, and each linking circuit, except the last, having its second input coupled to the output of the succeeding linking circuit, coupling being by way of the, or one of the, functional logic circuits where required.

13. Apparatus according to claim 12 wherein the signal path divides into a number of branches at the, or one of the, functional logic circuits, there being one linking circuit preceding the functional logic circuit at which branching occurs and one linking circuit following the functional logic circuit in each branch with its first input coupled to an output of the functional logic circuit for that branch, the linking circuit preceding the functional logic circuit having one second input for each branch and connected to the output of a linking circuit in that branch, and one first input and being arranged to hold a state representing a code value received at its first input if the code values applied to all the second inputs represent data and the code value applied to the first input represents the absence of data, or vice versa.

14. Apparatus according to claim 12 wherein the signal path is one of a number of such signal paths which merge at the input to a functional logic circuit which has an input for each path to be merged coupled to the output of a last linking circuit in that path and a single output coupled to the first input of a single linking circuit, the output of the single linking circuit being coupled to the second input of each said last linking circuit.

15. An apparatus according to claim 11 wherein the functional logic circuit comprises:
 a logic device for carrying out a logical process, and
 means for ensuring that the result of the process is not output from the logic circuit until all code values applied to inputs of the logic circuit represent data values.

16. A functional logic circuit for use with a linking circuit according to claim 1 or 3 comprising logic means for carrying out a logical process, and guard means comprising first and second state holding means with outputs connected to first and second output connections of the logic circuit, respectively, wherein the guard means also comprises means for preventing the output of the logic means from appearing at the output formed by the first and second state holding means unless all code values received at all circuit inputs to the functional logic circuit represent the same state, or states separated by one state in the sequence of operation of the finite state machine.

17. A circuit comprising a linking circuit according to claim 1 and a functional logic circuit for use with linking circuits, comprising
 logic means for carrying out a logical process, and
 guard means for ensuring that the result of the process is not output from the logic circuit until all code values applied to inputs of the logic circuit representing data values.

18. A functional logic circuit for use with linking circuits, comprising:
 a logic means for carrying out a logical process, and
 guard means for ensuring that the result of the process is not output from the logic circuit until all code values applied to inputs of the logic circuit represent data values,
 wherein the logic means comprises
  one AND gate for each possible selection of input connections, in which one connection is selected from each said two-connection input to form one AND gate input,
  a first EXOR gate coupled to received, as inputs, the outputs of all of the said AND gates which provide a '1' for one binary data value, and
  a second EXOR gate coupled to receive, as inputs, the outputs of all of the said AND gates which provide a '1' for the other binary value as inputs, the outputs of the EXOR gates forming the logic outputs of the logic means.

19. A functional logic circuit for use with linking circuits, comprising:
 logic means for carrying out a logical process, and
 guard means for ensuring that the result of the process is not output from the logic circuit until all code values applied to inputs of the logic circuit represent data values,
 first and second output connections, and
 wherein the guard means comprises first and second state holding means with outputs connected to the first and second output connections, respectively, and inputs connected to outputs of the logic means.

20. A method of carrying out logical processing on a succession of data values using a succession of alternating linking circuits and functional logic circuits, in which the logical processes are carried out, wherein in the circuits the code values are represented by different states of a predetermined finite state machine, none of these states having a transition to itself, each state being represented by a combination of logic values and all transitions between states requiring a change in a predetermined number of the logic values, and each circuit temporarily holds one state as it passes along the succession of circuits, comprising
 initialising the linking circuits to take up a different state from each adjacent linking circuit in the succession thereof,
 initialising each functional logic circuit to take up the same state as the preceding liking circuit,
 applying the data as a succession of code values to the beginning of the succession of circuits,
 for each linking circuit except the first, repeatedly changing the state held by that circuit to the state held by the preceding circuit if, and only if, the state held by the succeeding circuit differs from that held by the preceding circuit and the transition from the state held to the state next to be held is legitimate as defined by the finite state machine, and
 removing the code values at the end of the succession of circuits to output data values.

21. A method according to claim 20 wherein the finite state machine has three states, comprising first and second states representing different respective code values which each represent data and a third state representing a further code value which represents the absence of data, and the finite state machine has transitions to and from the first and third states, and to and from the second and the third states, only, and in applying the code values and initialising the linking circuits, alternate code values represent the first or second state, and the third state, respectively.

22. A method according to claim 20 wherein the finite state machine has four states, each representing a code value and the machine has transitions to and from all states except where a transition would require a change in two logic values, two code values are provided for each data value and when a data value is to be transmitted immediately after the transmission of the same data value, a different code value is used from the code value used immediately before.

23. A method according to claim 20 wherein, for a transition between states in the finite state machine, the predetermined number of logic values required to change is one.

* * * * *